United States Patent
Loval et al.

(10) Patent No.: US 6,181,205 B1
(45) Date of Patent: Jan. 30, 2001

(54) COMPACT POWER AMPLIFIER FOR MICROWAVE CIRCUITS

(75) Inventors: Lucien Loval, Wattignies; Jean-Claude Sarkissian, Toulouse; Michel Soulard, Mountigny Les Cormeilles, all of (FR)

(73) Assignee: Alcatel, Paris (FR)

(*) Notice: Under 35 U.S.C. 154(b), the term of this patent shall be extended for 0 days.

(21) Appl. No.: 09/310,956

(22) Filed: May 13, 1999

(30) Foreign Application Priority Data

May 14, 1998 (FR) .................................................. 98 06084

(51) Int. Cl.[7] .............................. H03F 3/16; H03F 3/60; H03F 3/68; H03F 3/14
(52) U.S. Cl. .......................... 330/277; 330/286; 330/295; 330/307
(58) Field of Search ................................... 330/277, 286, 330/295, 302, 307

(56) References Cited

U.S. PATENT DOCUMENTS

| 4,291,286 | * | 9/1981 | Wagner | 333/166 |
| 4,543,535 | * | 9/1985 | Ayasli | 330/286 |
| 5,012,203 |   | 4/1991 | Beyer et al. . | |
| 5,172,074 | * | 12/1992 | Shiga | 330/277 |

FOREIGN PATENT DOCUMENTS 0 012 093 A1  6/1980 (EP) .

OTHER PUBLICATIONS

S. D. Agostino et al, "A 0.5–12 Ghz Hybrid Matrix Distributed Amplifier using Commercially Available FETS".
MTT–S International Microwave Symposium Digest, Boston, Jun. 10–14, 1991, vol., 1, Jun. 10, 1991, pp. 289–292, XP000260409.

* cited by examiner

*Primary Examiner*—Robert Pascal
*Assistant Examiner*—Patricia T. Nguyen
(74) *Attorney, Agent, or Firm*—Sughrue, Mion, Zinn, Macpeak & Seas, PLLC

(57) ABSTRACT

A power amplifier for microwave signals, the amplifier comprising a plurality of identical transistors, wherein: the grid buses of two adjacent transistors are interconnected by a grid matching circuit; the drain arrays of two adjacent transistors are interconnected by a drain matching circuit; the grid matching circuits are selected in such a manner as to ensure input levels to each transistor that are identical in amplitude and in phase; and the drain matching circuits are selected in such a manner as to present each transistor with optimum power impedance. The amplifier input is on the grid bus of a transistor at one end of the series connection of transistors and the amplifier output is on the drain array of a transistor at the other end of the series connection of transistors. It is thus possible to assemble an arbitrary number of transistors in a power amplifier, while providing an amplifier that occupies a smaller area.

5 Claims, 2 Drawing Sheets

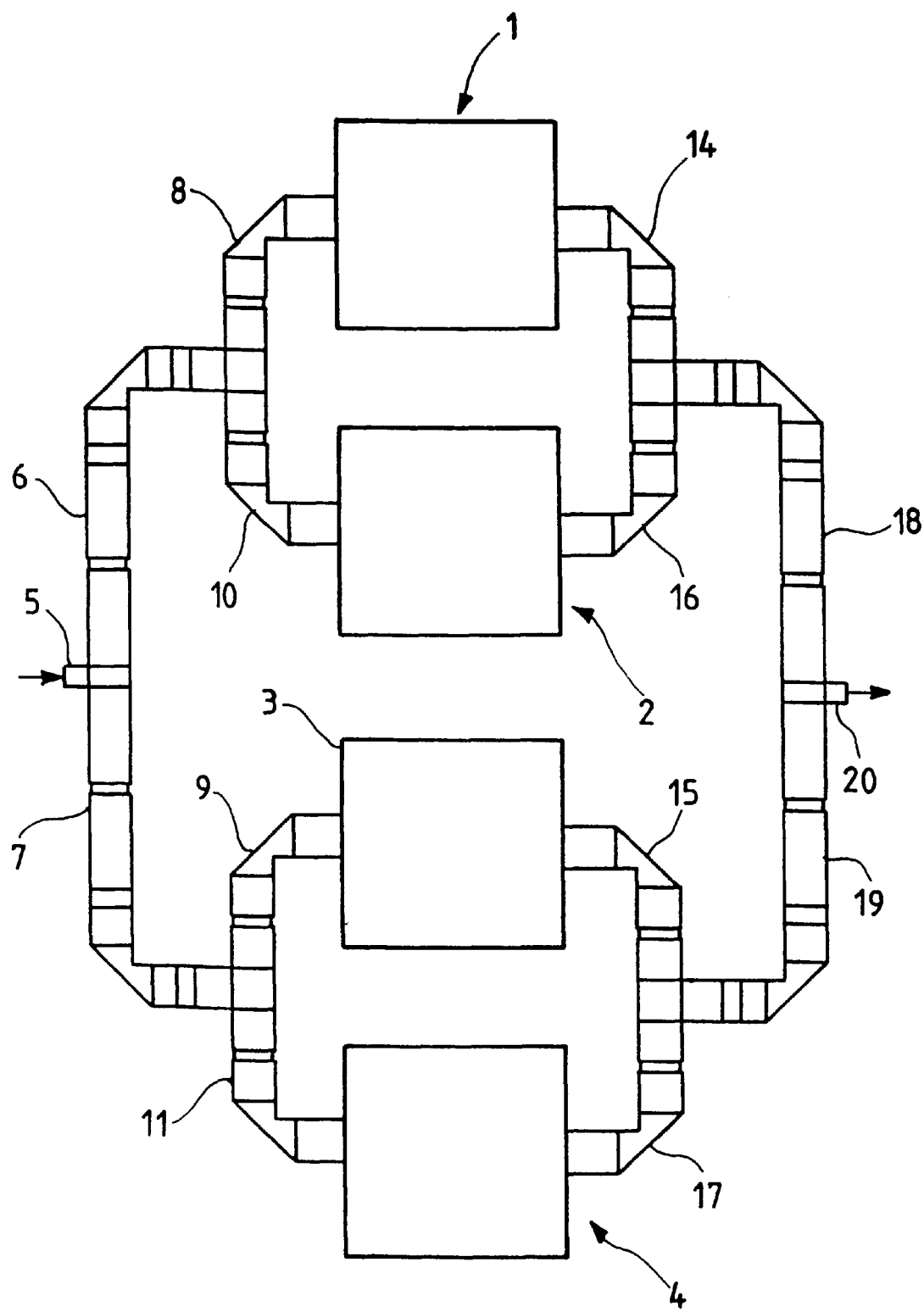
FIG_1  PRIOR ART

FIG_2
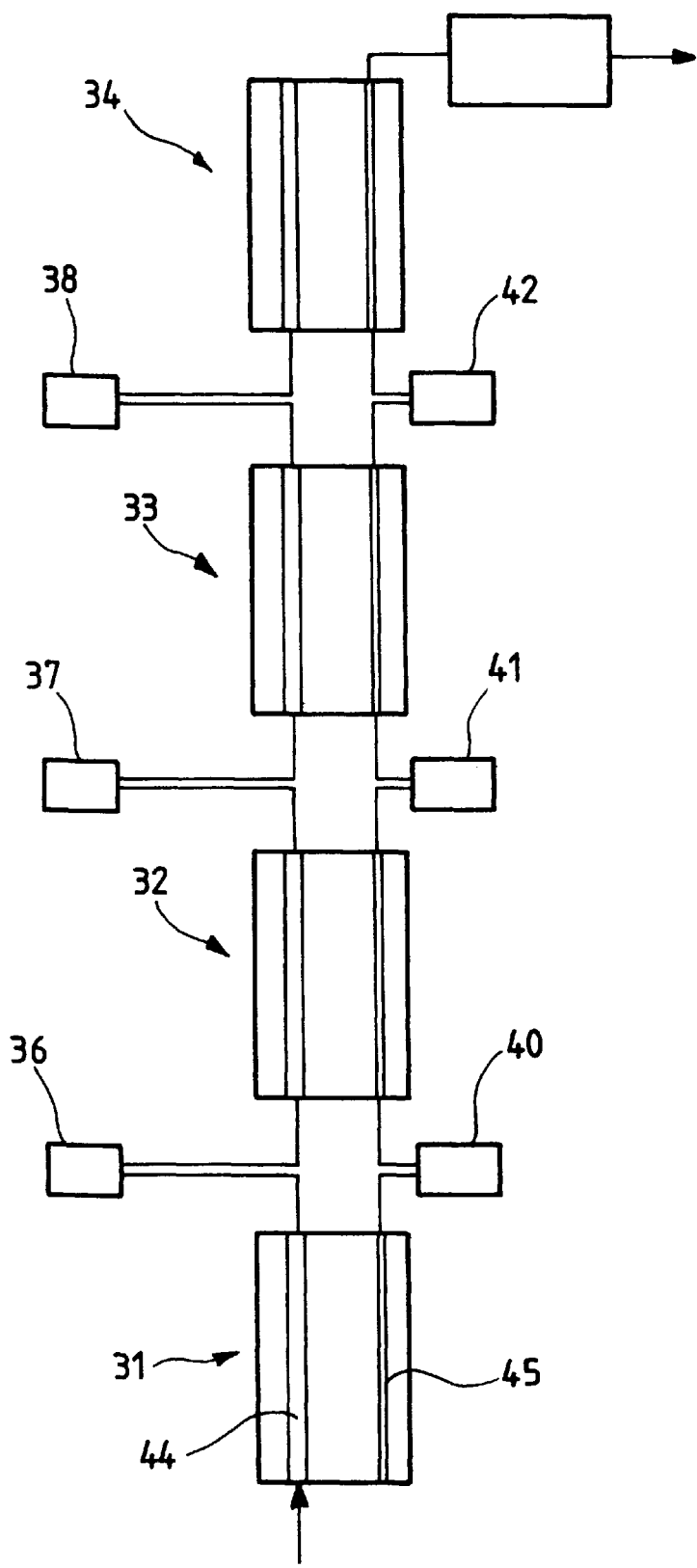

COMPACT POWER AMPLIFIER FOR MICROWAVE CIRCUITS

The present invention relates to microwave circuits, and more particularly to those using monolithic microwave integrated circuit (MMIC) technology. More precisely, the invention relates to a compact amplifier circuit in MMIC technology.

BACKGROUND OF THE INVENTION

MMIC technology is commonly used for making microwave circuits for processing microwave signals, i.e. signals typically lying in the frequency range 1 GHz to 50 GHz or more.

FIG. 1 shows an example of a known power amplifier in MMIC technology. The amplifier of FIG. 1 has four transistors 1 to 4 operating in parallel and fed by symmetrical voltage divider circuits; they output signals to voltage combiner circuits that are likewise symmetrical. In the example of FIG. 1, the amplifier has two input divider stages, and two output combiner stages. The input signal to the amplifier is applied to an input terminal 5, and is then divided into two signals that are equal in amplitude and in phase in two branches 6 and 7. The signals in each of these branches are in turn separated into two identical signals which are applied to the grid buses of the transistors 1 to 4. More precisely, the signals in branch 6 are separated into two signals on branches 8 and 10, which are applied to the grid buses of transistors 1 and 2; the signals on branch 7 are separated into two signals on branches 9 and 11, which are applied to the grid buses of transistors 3 and 4. At the outputs from the transistors, the circuit is symmetrical about a line through the transistors. The signals delivered by the drain arrays of the transistors 1 and 2 to branches 14 and 16 are combined and applied to a branch 18 while the signals supplied by the drain arrays of the transistors 15 and 17 are combined and applied to a branch 19. The signals from the branches 18 and 19 are combined and constitute the output signal on terminal 20.

The circuit of FIG. 1 presents the advantage of being very simple in design, with the signals being easy to divide and to combine. Nevertheless, it suffers from the drawback of being adaptable only to a number of transistors that is equal to an integer power of 2, four transistors in the example of FIG. 1. This can lead to difficulties when dimensioning the various transistors forming the circuit. In addition, the circuit of FIG. 1 occupies a large area on the circuit-supporting medium.

OBJECT AND SUMMARY OF THE INVENTION

The invention seeks to solve the problem of the bulkiness of amplifier circuits made using MMIC technology. It also has the object of solving the problem of assembling together an arbitrary number of transistors.

More precisely, the invention provides a power amplifier for microwave signals, the amplifier comprising a plurality of identical transistors, wherein: the grid buses of two adjacent transistors are interconnected by a grid matching circuit; the drain arrays of two adjacent transistors are interconnected by a drain matching circuit; the grid matching circuits are selected in such a manner as to ensure input levels to each transistor that are identical in amplitude and in phase; and the drain matching circuits are selected in such a manner as to present each transistor with optimum power impedance.

In an embodiment, the amplifier has an input terminal on the grid bus of a transistor; it may have an output terminal on the drain array of a transistor.

Advantageously, the amplifier is made out of MMIC technology.

BRIEF DESCRIPTION OF THE DRAWINGS

Other characteristics and advantages of the invention appear on reading the following description of embodiments of the invention given by way of example and with reference to the accompanying drawings, in which:

FIG. 1 is a diagram of a portion of a prior art four-transistor MMIC technology amplifier; and FIG. 2 is a diagram of a four-transistor MMIC technology amplifier of the invention.

MORE DETAILED DESCRIPTION

In an MMIC technology power amplifier, the invention proposes placing the transistors substantially in alignment, as in the prior art circuit; however, unlike that circuit, it proposes to interconnect the grid buses and the drain arrays of adjacent transistors by respective matching circuits. An appropriate choice of matching circuit then makes it possible for the amplifier to have its input on the grid bus of a transistor at one end of the circuit, and its output on the drain array at the other end of the circuit.

FIG. 2 is a diagram of a four-transistor MMIC technology amplifier of the invention. The choice of four transistors as in the example of FIG. 1 facilitates comparison with the prior art, but the invention is not limited thereto.

The amplifier of FIG. 2 has four transistors 31 to 34 in a common source configuration and operating in series. The grid buses of any two adjacent transistors are interconnected by a circuit for matching impedance and phase; the circuits 36, 37, and 38 are disposed respectively between the grid buses of transistors 31 & 32, 32 & 33, and 33 & 34. The drain arrays of any two adjacent transistors are interconnected by a circuit for matching impedance and phase; the circuits 40, 41, and 42 are disposed respectively between the drain arrays of transistors 31 & 32, 32 & 33, and 33 & 34. References 44 and 45 designate respectively, for the transistor 31, the grid and drain buses.

The input of the amplifier is advantageously to the grid bus of a transistor situated at one end of the series connection of transistors. In the example of FIG. 2, the input of the amplifier is on the grid bus of transistor 31. The output of the amplifier can be on the drain array of a transistor situated at the other end of the series connection of transistors, in the example of FIG. 2, the output is on the drain array of the transistor 34 which is situated at the other end of the line of transistors.

The grid matching circuits 36, 37, and 38 are selected so that the transistors 31 to 34 of the amplifier are fed in the same manner both in amplitude and in phase. As in the prior art circuit, this makes it possible to use transistors that are identical.

The drain matching circuits 40, 41, and 42 are selected so as to match the output impedance of each transistor and so as to ensure that the powers output by the transistors are combined in-phase. This ensures that each transistor operates in optimum manner in the amplifier, i.e. in compliance with its own specifications; combining the powers output by the transistors in-phase ensures optimum overall efficiency for the amplifier as a whole.

The grid matching circuits and the matching circuits are implemented in conventional manner by network synthesis; this technique is known to the person skilled in the art. Such synthesis guarantees the looked-for result: feed to the various transistors a signal that is identical in amplitude and phase for the grid matching circuits; impedance matching of the transistors in-phase combination of powers for the drain matching circuits.

Compared with the circuit of FIG. 1, the circuit of FIG. 2 makes it possible to achieve a saving in area of about 20%; this saving in area is due particularly to the absence of combiners in the circuit of FIG. 2.

The invention thus provides better integration, and makes it possible to reduce the cost of circuits that include such an amplifier. Increasing integration density makes it possible to obtain a corresponding reduction in the cost of integration.

Naturally, the present invention is not limited to the embodiments described and shown, and numerous variants thereof can be provided by the person skilled in the art. Thus, the invention clearly makes it possible to build a power amplifier using an arbitrary number of transistors; as explained with reference to FIG. 2, it suffices under such circumstances to provide matching circuits that ensure input levels to each transistor that are identical in amplitude and in phase, and output matching circuits that serve to present each transistor with optimum power impedance.

The invention is described in the context of MMIC technology. It can also be implemented in hybrid technology, with the matching networks and/or the transistors being applied to a substrate.

What is claimed is:

1. A power amplifier for microwave signals, the amplifier comprising a plurality of identical transistors each having a grid and a drain, wherein:

the grids of two adjacent transistors are interconnected by a grid matching circuit selected in such a manner as to ensure input levels to each transistor that are identical in amplitude and phase; and the drains of said two adjacent transistors are interconnected by a drain matching circuit selected in such a manner as to match the output impedances of said two transistors so as to combine outputs of said two transistors in phase.

2. An amplifier according to claim 1, having an input terminal on the grid one of said plurality of identical transistors.

3. An amplifier according to claim 1, having an output terminal on the drain one of said plurality of identical transistors.

4. An amplifier according to claim 1, made using MMIC technology.

5. An amplifier according to claim 1, wherein the only connection between the grids of said two adjacent transistors is said grid matching circuit and the only connection between the drains of said two adjacent transistors is said drain matching circuit.

* * * * *